United States Patent [19]

Blankenship

[11] Patent Number: 4,999,744
[45] Date of Patent: Mar. 12, 1991

[54] EJECTOR MECHANISM

[75] Inventor: Lowel E. Blankenship, Athens, Ala.

[73] Assignee: Universal Data Systems, Inc., Huntsville, Ala.

[21] Appl. No.: 458,266

[22] Filed: Dec. 28, 1989

[51] Int. Cl.⁵ .............................................. H05K 7/14
[52] U.S. Cl. .................................... 361/415; 211/41; 361/391; 439/64; 439/157; 439/160
[58] Field of Search ................... 211/41; 361/391, 399, 361/412, 413, 415; 439/59, 64, 152–160, 372

[56] References Cited

U.S. PATENT DOCUMENTS

| | | | |
|---|---|---|---|
| 4,233,646 | 11/1980 | Leung et al. | 439/157 |
| 4,313,150 | 1/1982 | Chu | 361/415 |
| 4,537,454 | 8/1985 | Douty et al. | 439/157 |
| 4,632,588 | 12/1986 | Fitzpatrick | 361/415 |
| 4,869,678 | 9/1989 | Schwenk et al. | 439/157 |
| 4,875,867 | 10/1989 | Hoo | 361/415 |

Primary Examiner—Gregory D. Thompson
Attorney, Agent, or Firm—Charles L. Warren; Anthony J. Sarli, Jr.

[57] ABSTRACT

This ejector mechanism supplies a force to remove an assembly of printed circuit boards (PCB's) from an enclosure. Each PCB in the assembly is electrically connected by a projecting rear portion of the PCB which engages a multiple contact connector attached to the enclosure. The friction associated with such engagement resists sliding the PCB assembly to disengage the connector. In an embodiment, a U-shaped lever is pivotally mounted to the assembly and applies a distributed force through each leg which is substantially adjacent each PCB. This provides force application substantially in the place of each PCB, thereby maximizing the desired force and minimizing undesired torque on each PCB.

5 Claims, 1 Drawing Sheet

EJECTOR MECHANISM

BACKGROUND OF THE INVENTION

This invention is directed to a manually operable ejector mechanism for removing an edge connected printed circuit board (PCB) from a connector mounted within an enclosure.

Electrical connection is commonly made with PCB's by means of a connector jack which receives and engages metal runners projecting on an extended portion of the PCB. This connector normally includes a plurality of conductive spring-loaded contacts that engage each of the PCB conductors. The compression force applied to the PCB by the connector contacts provides resistance to slidably removing the PCB from the connector.

Enclosures are commonly designed to receive a plurality of edge mounted PCB's. Each PCB typically has a front panel assembly mounted thereto. A plurality of PCB's may be grouped together and mounted to a single panel. The front panels are normally disposed relative to the enclosure in the operational (engaged) position such that it is difficult to directly grasp the panel and remove the attached PCB's.

This problem can of course be addressed by mounting a conventional fixed handle to the front panel. However, this is not desirable in all installations. It is also known to provide a pivotally mounted lever to the PCB assembly where one end of a substantially straight lever can engage a fixed element of the enclosure to provide a mechanical advantage to urge the PCB assembly from the connector. This mechanism provides relatively satisfactory results when utilized with a single PCB with a front panel. The use of two or more PCB's mounted to a single front panel often renders such a lever having a single fulcrum ineffective. The single force application point provided by such a lever, especially in a multiple PCB assembly, often does not supply an optimal removal force.

It is an object of the present invention to provide an improved ejector mechanism especially suited for removal of multiple PCB assemblies.

DETAILED DESCRIPTION

Figure 1:
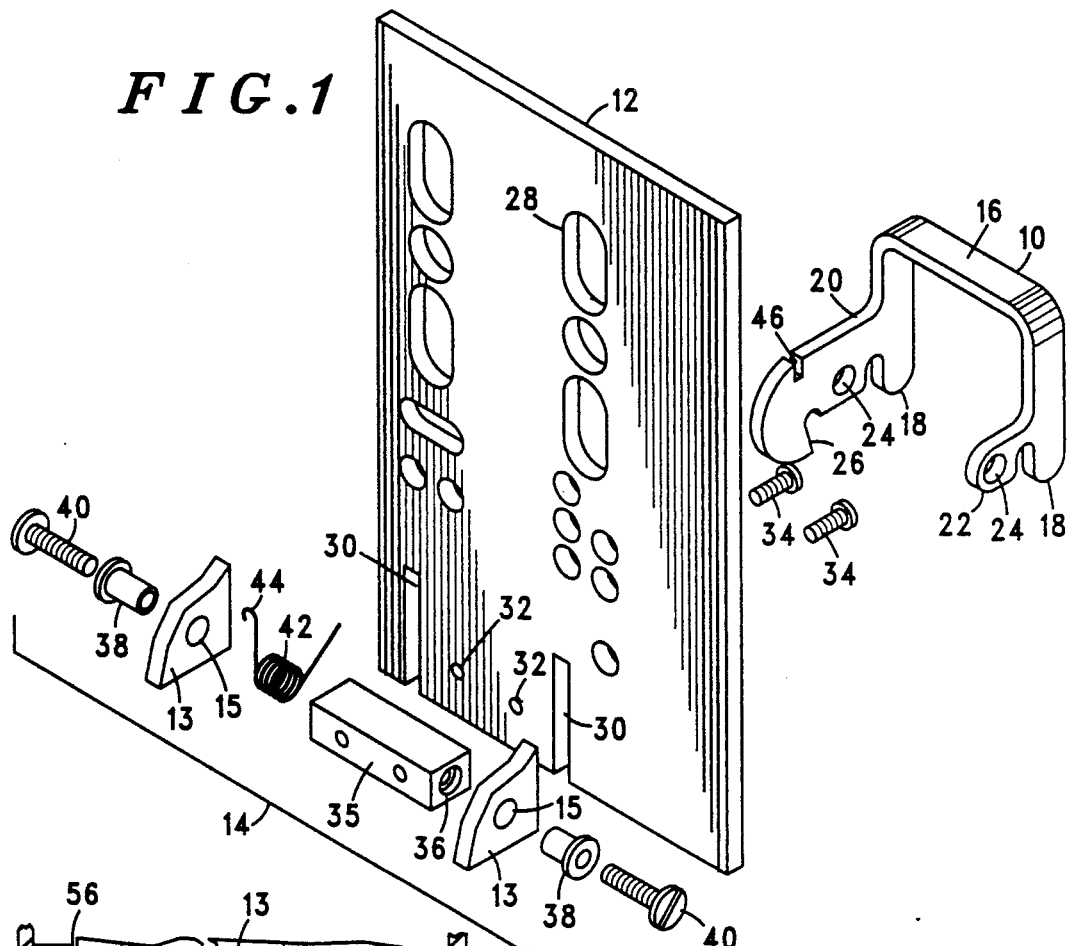
FIG. 1 is an exploded isometric view of an embodiment of an ejector mechanism in accordance with the present invention.

FIG. 1 is an exploded view showing an ejector 10 according to the present invention in relationship to a front panel 12 and two PCB's 13. A mounting assembly 14 attaches ejector 10 and the PCB's 13 to panel 12. Ejector 10 preferably consists of a U-shaped rigid element having a handle portion 16 and two legs with rounded distal ends 18. The two leg portions of handle 16 contain lateral projections 20 and 22, respectively. Each of these projections have a hole 24 which serves as the pivot point for the ejector. Preferably, the pivot point is disposed nearer ends 18 to provide a mechanical advantage. Projection 20 preferably includes a projecting abutment surface 26 which enables the ejector to lock the front panel 12 in an engaged position, i.e. with the PCB's engaging the connectors.

Front panel 12 which is preferably formed of metal may include a plurality of holes 28 disposed to accommodate displays, switches, and other functions associated with each PCB. Slots 30 are disposed to receive projections 20 and 22. Holes 32 receive screws 34 to mountf the assembly to panel 12.

Figure 2:
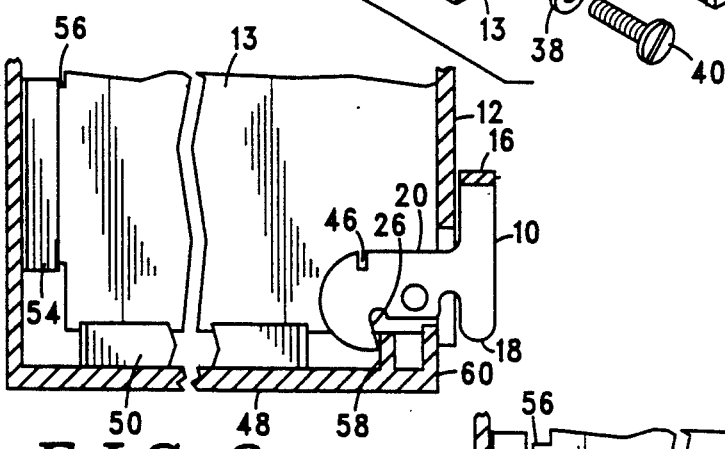
FIG. 2 is a cross-sectional view illustrating a PCB assembly which incorporates an embodiment of the present invention engaging a connector in a enclosure.

The mounting assembly 14 serves to mount the ejector 10 to panel 12 and may serve to assist in mounting the PCB's 13 to panel 12 via holes 15. Threaded holes 36 in opposing ends of mounting block 35 each receive a screw 40 which secures a bushing 38 thereto. A spring 42 mounts about bushing 38 in the end of block 35 adjacent ejector projection 20. A bent end 44 of spring 42 is disposed to engage a notch 46 in projection 20 in the assembled position and provides a normal bias causing ejector 10 to be biased to the position as shown in FIG. 2. The other end of the spring engages panel 12.

In order to maximize the functionality of mounting block 35, preferably the two PCB's 13 each have holes 15 in the lower front corner and are secured to block 35 between the bushings 38 and screws 40 thereby securing the printed circuit board to panel 12.

FIG. 12 illustrates a cross-sectional view of ejector 10 mounted to PCB's 13 and panel 12. This assembly is shown engaging electrical connector 54 within an enclosure 48. This enclosure preferably includes a guide 50 which guides the lower edge of PCB 13. This facilitates engagement of projecting portion 56 of the PCB with rear mounted electrical connector 54. This establishes electrical connections with the PCB in a well-known manner. However, any mating jack and connector could be used to establish the electrical connections.

It will be apparent that FIG. 2 illustrates only one PCB board 13 which is mounted adjacent projection 20. Another PCB 13 is mounted adjacent projectionm 22 as seen in FIG. 1. Enclosure 48 preferably includes a stop 58 disposed to be engaged by abutment surface 26 when the PCB assembly is in its operative condition as shown in FIG. 2. Spring 42 provides a bias causing ejector 10 to be biased counterclockwise as seen in FIG. 2 and thereby cause abutment surface 26 to engage stop 58. This constitutes a lock mechanism to prevent accidental disengagement.

Figure 3:
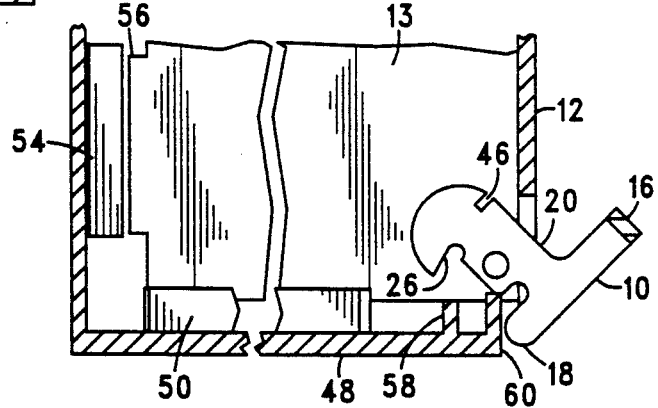
FIG. 3 is similar to FIG. 2 but with the embodiment of the ejector mechanism shown in its operative position having moved the PCB assembly forwqard to disengage the connector.

FIG. 3 shows that enjector 10 has been manually moved from the operational position as shown in FIG. 2 to the ejected position as shown in FIG. 3. Projection 56 of PCB 13 has been moved forward and no longer engages connector 54. This action was caused by the translational force exerted upon panel 12 when handle 16 was rotated clockwise as shown in FIG. 3. This causes distal ends 18 to engage a forward surface 60 of enclosure 48. The rotation of ejector 10 causes abutment surface 26 to disengage stop 58 permitting the PCB assembly to slide forward (to the right as shown in FIG. 3). Distal ends 18 are free to pivot through slots 30 in panel 12 and engage surface 60 simultaneously thereby providing two spaced apart points for force application. Each of the force application points apply a force substantially adjacent each PCB and serves to transfer a substantially translational force to each PCB.

This should be contrasted with a single lever which provides only a single point of force application which would not be substantially in the plane of the PCB's.

The ejector according to the present invention applies separate forces substantially in the plane of each of the PCB's and thus tends to minimize the transmission of undesired torque and maximize the desired in-line force to the PCB's.

In a preferred embodiment according to the present invention each of a plurality of PCB's mounted to a common panel would have an adjacent point of force application applied by means of a corresponding distal end of an ejector. For example, in a three PCB assembly, the ejector could be similar to that shown in FIG. 1 but include an additional center leg to form an "m" which would provide a distal end for each of the three PCB's and thereby maximize the application of force in accordance with the present invention. Alternatively, the U-shaped ejector as shown in FIG. 1 could be used with more than two PCB's by disposing each leg adjacent the outside PCB's thereby relying on the front panel to supply force distribution to the interior PCB's.

A further aspect of the present invention resides in the economies of attaching the ejector, the PCB's, and the front panel utilizing a common mounting assembly 14. This minimizes the number of parts required and enhances manufacturability.

Although embodiments of the present invention have been shown and described herein, the scope of the invention is defined by the claims which follow.

I claim:

1. A printed circuit board (PCB) assembly configured to slide into an enclosure comprising:

two spaced apart PCB's;

means mounted at the rear of each PCB for electrically connecting each PCB with a connector;

means for mounting one of said PCB's to the other PCB so that said PCB's are parallel to each other;

ejector means pivotally mounted to said mounting means for applying a distributed force against an object not part of said assembly when said assembly is seated in the enclosure to cause substantially translational motion of said assembly away from the enclosure, said ejector means comprising a manually operable U-shaped lever with a central handle and two legs each with a distal end, said legs being pivotally mounted to said mounting means adjacent said one and other PCB, respectively, so that force is applied adjacent each PCB against the object upon pivotal rotation of said lever, said handle and legs integrally made as a single rigid element.

2. The assembly according to claim 1 where said ejector means comprises means for removably locking said assembly to the enclosure.

3. The assembly according to claim 1 further comprising a front panel mounted to said mounting means and being substantially perpendicular to said PCB's.

4. The assembly according to claim 3 wherein said assembly has an inserted poosition relative to the enclosure when said PCB's are connected with the connector, said front panel being disposed between said PCB's and the distal ends of said legs when said assembly is in said inserted position.

5. The assembly according to claim 4 wherein said handle and distal ends form a plane substantially parallel and adjacent the front panel in said inserted position.

* * * * *